US012593448B2

(12) United States Patent
Kang et al.

(10) Patent No.: US 12,593,448 B2
(45) Date of Patent: Mar. 31, 2026

(54) SEMICONDUCTOR MEMORY DEVICES

(71) Applicant: Samsung Electronics Co., Ltd.,
Suwon-si (KR)

(72) Inventors: Sangmin Kang, Hwaseong-si (KR);
Junghwan Kim, Seoul (KR);
Hyungjoon Kim, Yongin-si (KR);
Jihoon Choi, Seongnam-si (KR)

(73) Assignee: SAMSUNG ELECTRONICS CO.,
LTD., Suwon-si (KR)

( * ) Notice: Subject to any disclaimer, the term of this
patent is extended or adjusted under 35
U.S.C. 154(b) by 525 days.

(21) Appl. No.: 17/962,577

(22) Filed: Oct. 10, 2022

(65) Prior Publication Data

US 2023/0164999 A1 May 25, 2023

(30) Foreign Application Priority Data

Nov. 22, 2021 (KR) ........................ 10-2021-0161370

(51) Int. Cl.
H10B 43/27 (2023.01)
H01L 23/528 (2006.01)
H10B 41/27 (2023.01)
H10B 41/35 (2023.01)
H10B 43/35 (2023.01)

(52) U.S. Cl.
CPC ......... H10B 43/27 (2023.02); H01L 23/5283
(2013.01); H10B 41/27 (2023.02); H10B
41/35 (2023.02); H10B 43/35 (2023.02)

(58) Field of Classification Search
CPC ..... H01L 23/5283; H10B 41/27; H10B 41/35;
H10B 43/27; H10B 43/35
See application file for complete search history.

(56) References Cited

U.S. PATENT DOCUMENTS

| | | | |
|---|---|---|---|
| 8,767,465 B2 | 7/2014 | Chang et al. | |
| 8,969,162 B2 | 3/2015 | Hwang et al. | |
| 9,356,031 B2 | 5/2016 | Lee et al. | |
| 9,887,207 B2 | 2/2018 | Zhang et al. | |

(Continued)

FOREIGN PATENT DOCUMENTS

| | | |
|---|---|---|
| CN | 109860197 A | 6/2019 |
| KR | 100363699 B1 | 12/2002 |
| KR | 1020200093075 A | 8/2020 |

OTHER PUBLICATIONS

Beshkova, Milena, et al., "Properties and Potential Applications of
Two-Dimensional AlN", Vacuum, vol. 176, pp. 109231-1-109231-
17 (Year: 2020).*

*Primary Examiner* — Fernando L Toledo
*Assistant Examiner* — Ryan T. Fortin
(74) *Attorney, Agent, or Firm* — Muir Patent Law, PLLC

(57) ABSTRACT

A semiconductor device includes gate electrodes on a sub-
strate and a memory channel structure extending through the
gate electrodes. The gate electrodes are spaced apart from
each other in a vertical direction substantially perpendicular
to an upper surface of the substrate. The memory channel
structure extends in the vertical direction on the substrate.
The memory channel structure includes a first filling pattern
extending in the vertical direction, a channel on a sidewall
of the first filling pattern, and a charge storage structure on
a sidewall of the channel. The first filling pattern includes a
material having a thermal conductivity equal to or more than
about 100 W/m·K at a temperature of about 25° C.

18 Claims, 18 Drawing Sheets

(56)    References Cited

U.S. PATENT DOCUMENTS

| | | | |
|---|---|---|---|
| 10,593,698 B2 | 3/2020 | Harari | |
| 10,804,279 B2 | 10/2020 | Hu et al. | |
| 2019/0198320 A1* | 6/2019 | Wells | H10B 43/27 |
| 2020/0119030 A1* | 4/2020 | Dasgupta | H10B 41/27 |
| 2021/0320125 A1* | 10/2021 | Shin | H10B 41/10 |

* cited by examiner 390 410

370
360 } 380
350
330
310
320
310
320
310
320
310
320
310
320
310
320
310
300
280
270 } 290
260
240
170
150
110
100

212
192
182
202
222
184
302 305 162 102 130 120 103 186 164
140 101 166

D1
D2 D3

D1

D2 → D3

435  395  385

450  415  375 365 355  450

460
440
330
315
325
315
325
315
325
315
325
315
325
315
325
315
300

470

240

212  222
192  202
182  184
170
150
110
100

305  162  186
102 130 120 103  164
140 101  166

D1
D2  D3

435   395    385

450       415 \ 375 365 355   450

440
330
315
325
315
325
315
325
315
325
315
325
315
325
315
300

480

240

212      222    170
192   202
182     184    150
110
100

162        186
305    102 130 120 \103   164   490
             140   101    166

D1

D2  →D3

SEMICONDUCTOR MEMORY DEVICES

CROSS-REFERENCE TO RELATED APPLICATIONS

This application claims priority under 35 U.S.C. § 119 to Korean Patent Application No. 10-2021-0161370, filed on Nov. 22, 2021, in the Korean Intellectual Property Office (KIPO), the contents of which are herein incorporated by reference in their entirety.

BACKGROUND

1. Field

The inventive concepts relate to a semiconductor device, more particularly, to a vertical memory device.

2. Description of the Related Art

As a semiconductor device having a high-capacity data storage is needed, the number of stacks of insulation patterns and sacrificial patterns for forming gate electrodes increases, and a length of channels extending through the stacks may increase. Thus, a large amount of heat is needed in order to crystallize the channel.

SUMMARY

Example embodiments provide a semiconductor device having improved characteristics.

According to an aspect of the inventive concept, there is provided a semiconductor device. The semiconductor device may include gate electrodes on a substrate and a memory channel structure extending through the gate electrodes. The gate electrodes may be spaced apart from each other in a vertical direction substantially perpendicular to an upper surface of the substrate. The memory channel structure may extend in the vertical direction on the substrate. The memory channel structure may include a first filling pattern extending in the vertical direction, a channel on a sidewall of the first filling pattern, and a charge storage structure on a sidewall of the channel. The first filling pattern may include a material having a thermal conductivity equal to or more than about 100 W/m·K at a temperature of about 25° C.

According to an aspect of the inventive concept, there is provided a semiconductor device. The semiconductor device may include gate electrodes on a substrate and a memory channel structure extending through the gate electrodes. The gate electrodes may be spaced apart from each other in a vertical direction substantially perpendicular to an upper surface of the substrate. The memory channel structure may extend in the vertical direction on the substrate. The memory channel structure may include a filling pattern structure extending in the vertical direction, a channel on a sidewall of the filling pattern structure, and a charge storage structure on a sidewall of the channel. The filling pattern structure may include a first filling pattern including a material having a thermal conductivity equal to or more than about 100 W/m·K at a temperature of about 25° C., and a second filling pattern on a sidewall of the first filling pattern and including a material having a thermal conductivity less than that of the first filling pattern.

According to an aspect of the inventive concept, there is provided a semiconductor device. The semiconductor device may include a lower circuit pattern on a substrate, a common source plate (CSP) over the lower circuit pattern, a gate electrode structure including gate electrodes spaced apart from each other in a vertical direction substantially perpendicular to an upper surface of the substrate, a memory channel structure extending through the gate electrode structure in the vertical direction on the CSP, and contact plugs connected to the gate electrodes, respectively, each of which extends in the vertical direction. The memory channel structure may include a first filling pattern extending in the vertical direction, a channel on a sidewall of the first filling pattern, and a charge storage structure on a sidewall of the channel. The first filling pattern may include a material having a thermal conductivity equal to or more than about 100 W/m·K at a temperature of about 25° C.

In the method of manufacturing a semiconductor device, the channel layer may be crystallized by a small amount of heat, and thus electrical characteristics of other structures adjacent to the channel layer may not deteriorate by heat.

DETAILED DESCRIPTION

The above and other aspects and features of a semiconductor device, a method of manufacturing the same, and an electronic system including the same in accordance with example embodiments will become readily understood from detail descriptions that follow, with reference to the accompanying drawings. Like numbers refer to like elements throughout. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section without departing from the teachings of inventive concepts. It will be appreciated that "planarization," "coplanar," "planar," etc., as used herein, refer to structures (e.g., surfaces) that need not be perfectly geometrically planar, but may include acceptable variances that may result from standard manufacturing processes.

Figure 1:
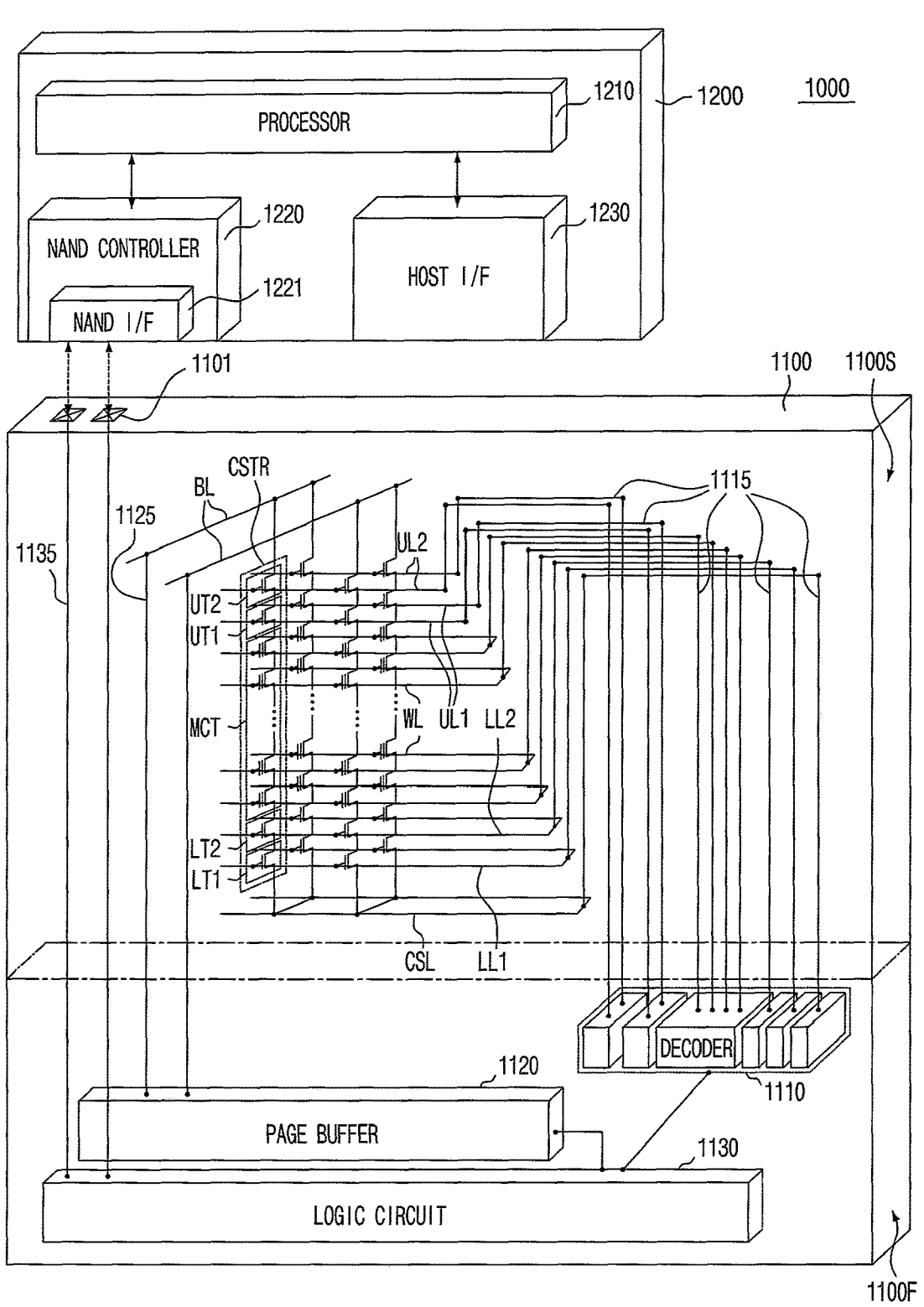
FIG. 1 is a schematic diagram illustrating an electronic system including a semiconductor device in accordance with some example embodiments.

FIG. 1 is a schematic diagram illustrating an electronic system including a semiconductor device in accordance with some example embodiments.

Referring to FIG. 1, an electronic system 1000 may include a semiconductor device 1100 and a controller 1200 electrically connected to the semiconductor device 1100. The electronic system 1000 may be a storage device including one and/or a plurality of semiconductor devices 1100 or an electronic device including a storage device. For example, the electronic system 1000 may be and/or may be included in a solid state drive (SSD) device, a universal serial bus (USB), a computing system, a medical device, and/or a communication device that may include one and/or a plurality of semiconductor devices 1100.

The semiconductor device 1100 may be a non-volatile memory device, for example, a NAND flash memory device that will be illustrated with reference to FIGS. 4 to 18. The semiconductor device 1100 may include a first structure 1100F and a second structure 1100S on the first structure 1100F. In the drawing, the first structure 1100F is under the second structure 1100S, however, the example embodiments are not limited thereto; for example, the first structure 1100F may be beside and/or on the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second upper gate lines UL1 and UL2, first and second lower gate lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with example embodiments.

In some example embodiments, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In example embodiments, the lower transistors LT1 and LT2 may include a lower erase control transistor LT1 and a ground selection transistor LT2 that may be connected with each other in serial. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 1110 through first connection wirings 1115 extending to the second structure 1110S in the first structure 1100F. The bit lines BL may be electrically connected to the page buffer 1120 through second connection wirings 1125 extending to the second structure 1100S in the first structure 1100F.

In the first structure 1100F, the decoder circuit 1110 and the page buffer 1120 may perform a control operation for at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection wiring 1135 extending to the second structure 1100S in the first structure 1100F.

The controller 1200 may include a processor 1210, a NAND controller 1220, and a host interface 1230. The electronic system 1000 may include a plurality of semiconductor devices 1100, and in this case, the controller 1200 may control the plurality of semiconductor devices 1100.

The processor 1210 may control operations of the electronic system 1000 including the controller 1200. The processor 1210 may be operated by firmware, and may control the NAND controller 1220 to access the semiconductor device 1100. The NAND controller 1220 may include a NAND interface 1221 for communicating with the semiconductor device 1100. Through the NAND interface 1221, control command for controlling the semiconductor device 1100, data to be written in the memory cell transistors MCT of the semiconductor device 1100, data to be read from the memory cell transistors MCT of the semiconductor device 1100, etc., may be transferred. The host interface 1230 may provide communication between the electronic system 1000 and an outside host. When control command is received from the outside host through the host interface 1230, the processor 1210 may control the semiconductor device 1100 in response to the control command.

Figure 2:
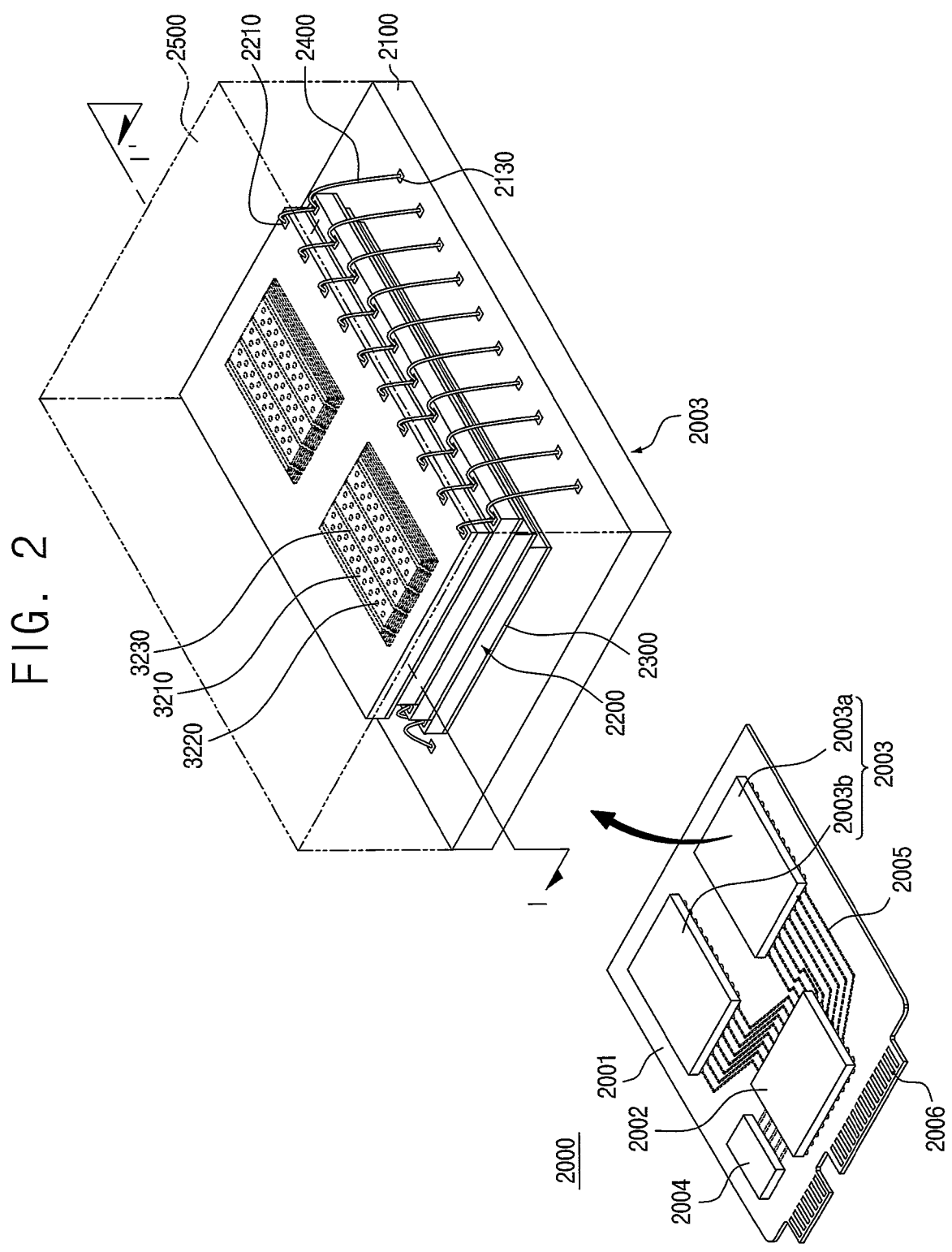
FIG. 2 is a schematic perspective view illustrating an electronic system including a semiconductor device in accordance with some example embodiments.

FIG. 2 is a schematic perspective view illustrating an electronic system including a semiconductor device in accordance with some example embodiments.

Referring to FIG. 2, an electronic system 2000 may include a main substrate 2001, a controller 2002 mounted on the main substrate 2001, at least one semiconductor package 2003, and a dynamic random access memory (DRAM) device 2004. The semiconductor package 2003 and the DRAM device 2004 may be connected to the controller 2002 by wiring patterns 2005 on the main substrate 2001.

The main substrate 2001 may include a connector 2006 having a plurality of pins connected to an outside host. The number and layout of the plurality pins in the connector 2006 may be changed depending on a communication interface between the electronic system 2000 and an outside host. In some example embodiments, the electronic system 2000 may communicate with the outside host according to one of a USB, peripheral component interconnect express (PCI-Express), serial advanced technology attachment (SATA), M-Phy for universal flash storage (UFS), etc. In some example embodiments, the electronic system 2000 may be operated by power source provided from the outside host through the connector 2006. The electronic system 2000 may further include power management integrated circuit (PMIC) (not illustrated) for distributing the power source provided from the outside host to the controller 2002 and the semiconductor package 2003.

The controller 2002 may write data in the semiconductor package 2003 and/or read data from the semiconductor package 2003, and may enhance the operation speed of the electronic system 2000.

The DRAM device 2004 may be a buffer memory for reducing the speed difference between the semiconductor package 2003 for storing data and the outside host. The DRAM device 2004 included in the electronic system 2000 may serve as a cache memory, and may provide a space for temporarily storing data during the control operation for the semiconductor package 2003. If the electronic system 2000 includes the DRAM device 2004, the controller 2002 may further include a DRAM controller for controlling the DRAM device 2004 in addition to the NAND controller for controlling the semiconductor package 2003.

The semiconductor package 2003 may include first and second semiconductor packages 2003a and 2003b spaced apart from each other. The first and second semiconductor packages 2003a and 2003b may be semiconductor packages each of which may include a plurality of semiconductor chips 2200. Each of the first and second semiconductor packages 2003a and 2003b may include a package substrate 2100, the semiconductor chips 2200, bonding layers 2300 disposed under the semiconductor chips 2200, a connection structure 2400 for electrically connecting the semiconductor chips 2200 and the package substrate 2100, and a mold layer 2500 covering the semiconductor chips 2200 and the connection structure 2400 on the package substrate 2100. Though only the first and second semiconductor packages 2003a and 2003b are illustrated, the number of the semiconductor packages is not so limited, and the electronic system 2000 may include more or fewer semiconductor packages.

The package substrate 2100 may be, for example, a printed circuit board (PCB) including package upper pads 2130. Each semiconductor chip 2200 may include at least one input/output pad 2210. The at least one input/output pad 2210 may correspond to the input/output pad 1101 of FIG. 1. Each semiconductor chip 2200 may include gate electrode structures 3210, memory channel structures 3220 extending through the gate electrode structures 3210, and division structures 3230 for dividing the gate electrode structures 3210. Each semiconductor chip 2200 may include a semiconductor device that will be illustrated with reference to FIGS. 4 to 18.

In some example embodiments, the connection structure 2400 may be a bonding wire for electrically connecting the input/output pad 2210 and the package upper pads 2130. For example, in each of the first and second semiconductor packages 2003a and 2003b, the semiconductor chips 2200 may be electrically connected with each other by a bonding wire method, and may be electrically connected to the package upper pads 2130 of the package substrate 2100. Alternatively, in each of the first and second semiconductor packages 2003a and 2003b, the semiconductor chips 2200 may be electrically connected with each other by a connection structure including a through silicon via (TSV), instead of the connection structure 2400 of the bonding wire method.

In some example embodiments, the controller 2002 and the semiconductor chips 2200 may be included in one package. In example embodiments, the controller 2002 and the semiconductor chips 2200 may be mounted on an interposer substrate different from the main substrate 2001, and the controller 2002 and the semiconductor chips 2200 may be connected with each other by a wiring on the interposer substrate.

Figure 3:
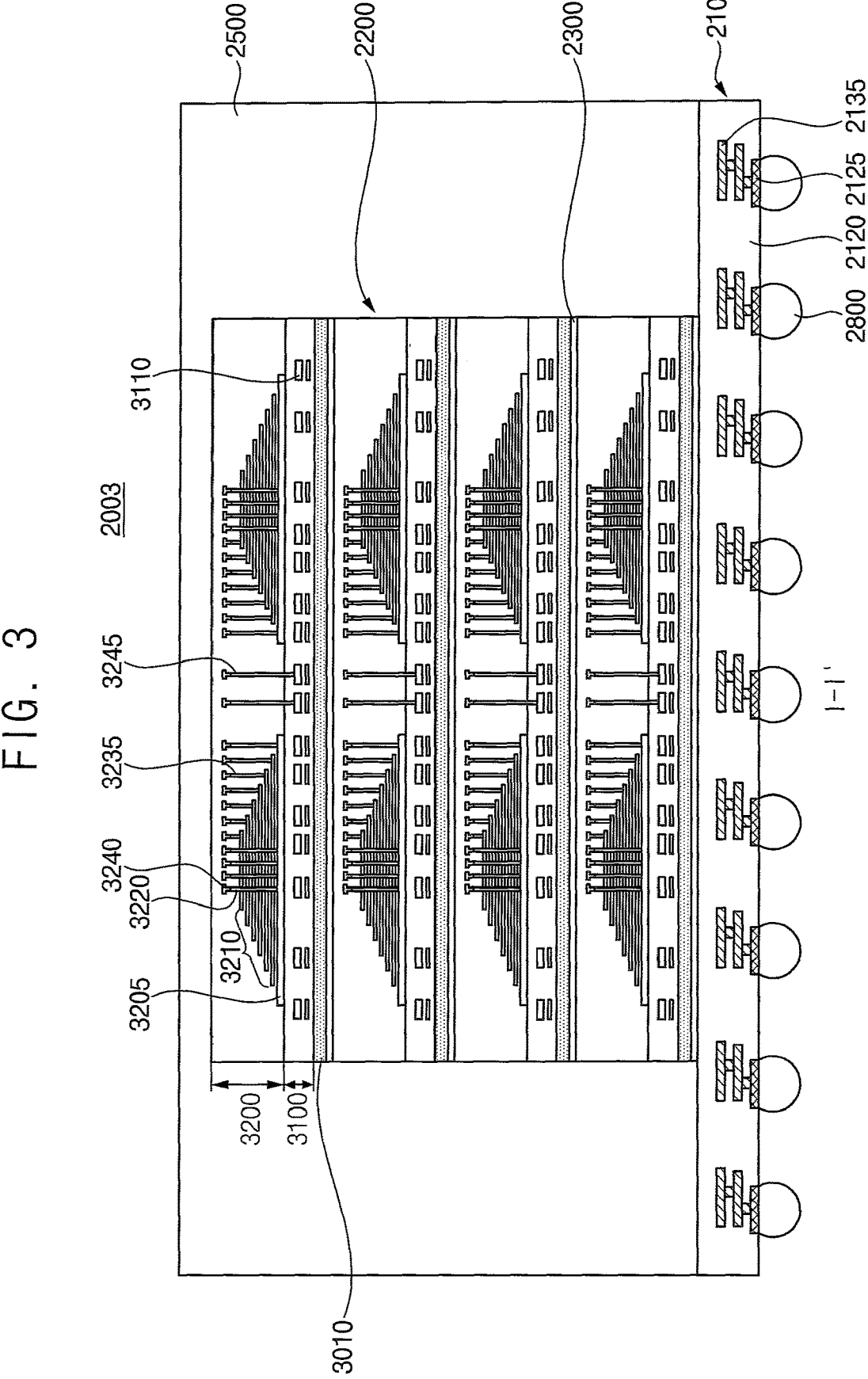
FIG. 3 is a schematic cross-sectional view illustrating a semiconductor package including a semiconductor device in accordance with some example embodiments.

FIG. 3 is a schematic cross-sectional view illustrating a semiconductor package including a semiconductor device in accordance with some example embodiments. FIG. 3 illustrates example embodiments of the semiconductor package 2003 shown in FIG. 2, and shows a cross-section taken along a line I-I' of the semiconductor package 2003 in FIG. 2.

Referring to FIG. 3, in the semiconductor package 2003, the package substrate 2100 may be a PCB. The package substrate 2100 may include a substrate body part 2120, the package upper pads 2130 (refer to FIG. 2) on an upper surface of the substrate body part 2120, package lower pads 2125 on and/or exposed through a lower surface of the substrate body part 2120, and inner wirings 2135 electrically connecting the package upper pads 2130 and the package lower pads 2125 in an inside of the substrate body part 2120. The package upper pads 2130 may be electrically connected to the connection structures 2400. The package lower pads 2125 may be connected to wiring patterns 2005 of the main substrate 2001 in the electronic system 2000 through conductive connection parts 2800, as shown in FIG. 3.

Each semiconductor chip 2200 may include a semiconductor substrate 3010, and a first structure 3100 and a second structure 3200 sequentially stacked on the semiconductor substrate 3010.

The first structure 3100 may include a peripheral circuit region in which peripheral circuit wirings 3110 may be formed. The second structure 3200 may include a common source line 3205, a gate electrode structure 3210 on the common source line 3205, memory channel structures 3220 and division structures 3230 (refer to FIG. 2) extending through the gate electrode structure 3210, bit lines 3240 electrically connected to the memory channel structures 3220, and gate connection wirings 3235 electrically connected to the word lines WL of the gate electrode structure 3210 (refer to FIG. 1).

Each semiconductor chip 2200 may include a through wiring 3245 being electrically connected to the peripheral circuit wirings 3110 of the first structure 3100 and extending in the second structure 3200. The through wiring 3245 may be disposed at an outside of the gate electrode structure 3210, and some through wirings 3245 may extend through the gate electrode structure 3210.

Each semiconductor chip 2200 may further include the input/output pad 2210 (refer to FIG. 2) electrically connected to the peripheral circuit wirings 3110 of the first structure 3100.

FIGS. 4 to 14 are cross-sectional views illustrating a method of manufacturing a semiconductor device in accordance with example embodiments.

This semiconductor device may correspond to the semiconductor device 1100 of FIG. 1, and the semiconductor chips 2200 of FIGS. 2 and 3.

Hereinafter, in the specification (and not necessarily in the claims), a direction substantially perpendicular to an upper surface of a substrate may be defined as a first direction D1, and two directions substantially parallel to the upper surface of the substrate and crossing each other may be defined as second and third directions D2 and D3, respectively. In example embodiments, the second and third directions D2 and D3 may be substantially perpendicular to each other.

Figure 4:
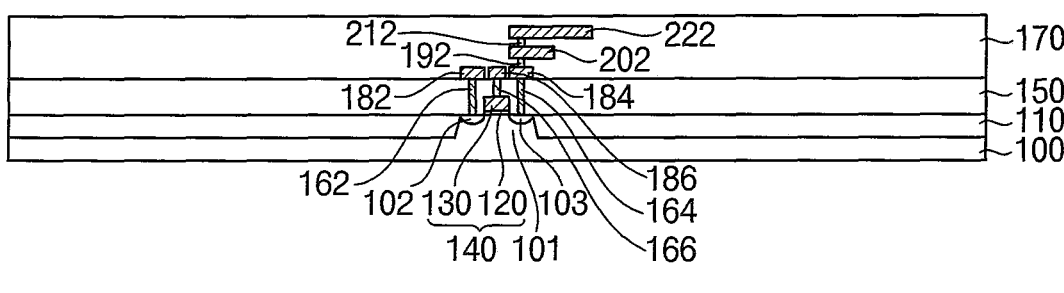
FIGS. 4 to 14 are cross-sectional views illustrating a method of manufacturing a semiconductor device in accordance with example embodiments.
Figure 4:
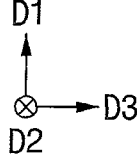

Referring to FIG. 4, a lower circuit pattern may be formed on a substrate 100, and first and second insulating interlayers 150 and 170 including an oxide, e.g., silicon oxide may be formed on the substrate 100 to cover the lower circuit pattern.

The substrate 100 may include silicon, germanium, silicon-germanium or a III-V group compound such as GaP, GaAs, GaSb, etc. In some embodiments, the substrate 100 may be a silicon-on-insulator (SOI) substrate or a germanium-on-insulator (GOI) substrate.

The substrate 100 may include a field region on which an isolation pattern 110 is formed and an active region 101 on which no isolation pattern is formed. The isolation pattern 110 may include an oxide, e.g., silicon oxide.

In example embodiments, the semiconductor device may have a cell over periphery (COP) structure. That is, the lower circuit pattern may be formed on the substrate 100, and memory cells, upper contact plugs and upper circuit pattern may be formed over the lower circuit pattern. The lower circuit pattern may include, e.g., transistors, lower contact plugs, lower wirings, lower vias, etc.

The transistor may include a lower gate structure 140 on the substrate 100 and first and second impurity regions 102 and 103 at upper portions of the active region 101 adjacent to the lower gate structure 140 serving as source/drain regions. The lower gate structure 140 may include a lower gate insulation pattern 120 and a lower gate electrode 130 sequentially stacked on the substrate 100.

The first insulating interlayer 150 may be formed on the substrate 100 to cover the transistors, and first and second lower contact plugs 162 and 164 extending through the first insulating interlayer 150 to contact the first and second impurity regions 102 and 103, respectively, and a third lower contact plug 166 extending in the first insulating interlayer 150 to contact the lower gate electrode 130 may be formed.

First to third lower wirings 182, 184, and 186 may be formed on the first insulating interlayer 150 to contact upper surfaces of the first to third lower contact plugs 162, 164, and 166, respectively. A first lower via 192, a fourth lower wiring 202, a second lower via 212, and a fifth lower wiring 222 may be sequentially stacked on the second lower wiring 184.

The second insulating interlayer 170 may be formed on the first insulating interlayer 150 to cover the first to fifth lower wirings 182, 184, 186, 202, and 222 and the first and second lower vias 192 and 212. In some embodiments, the second insulating interlayer 170 may be merged with the first insulating interlayer 150.

Each element included in the lower circuit pattern may be formed by, e.g., a damascene process or a patterning process.

Figure 5:
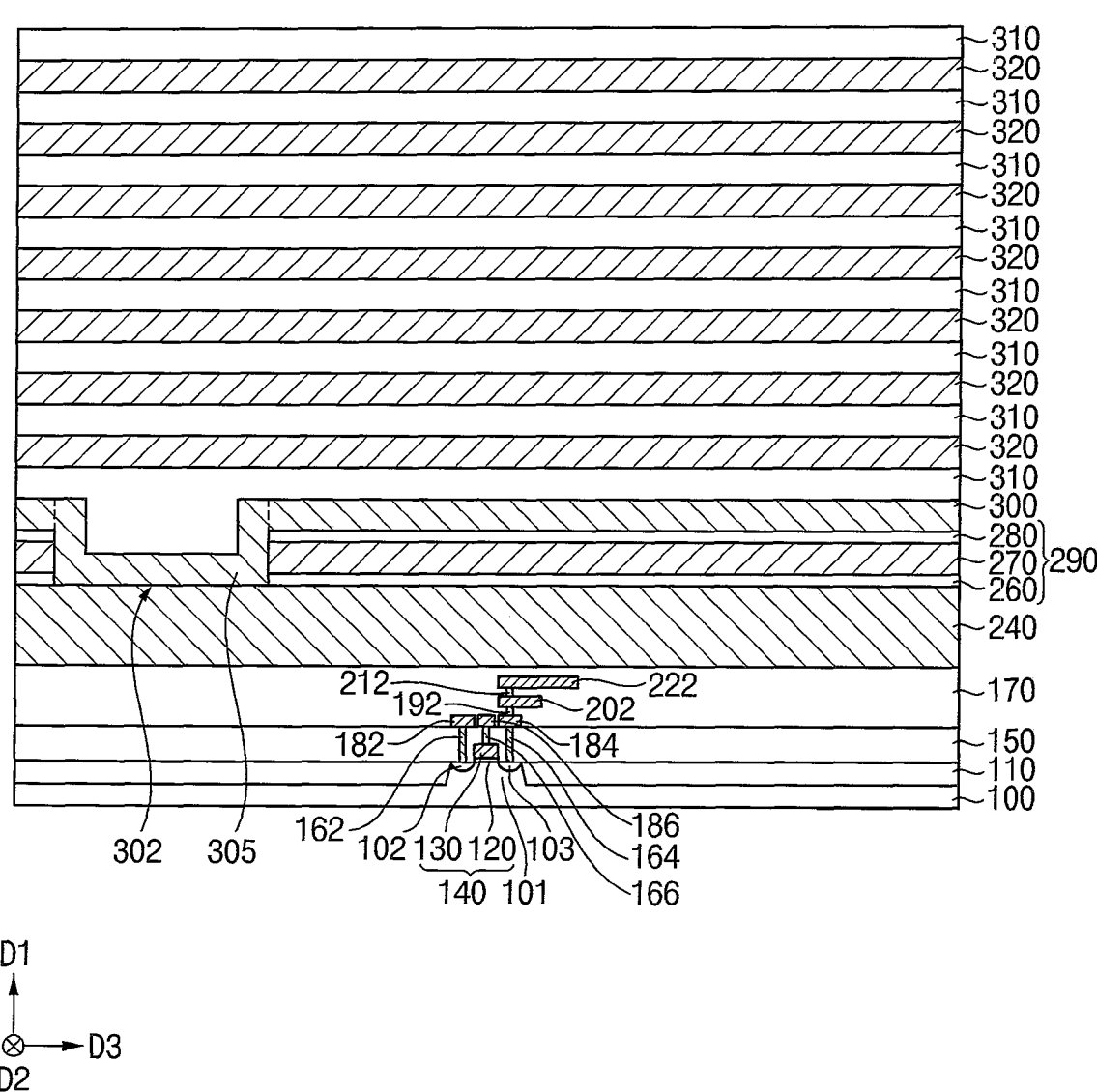

Referring to FIG. 5, a common source plate (CSP) 240 and a sacrificial layer structure 290 may be sequentially formed on the second insulating interlayer 170, the sacrificial layer structure 290 may be partially removed to form a first opening 302 exposing an upper surface of the CSP 240, and a support layer 300 may be formed on an upper surface of the sacrificial layer structure 290 and the exposed upper surface of the CSP 240.

The CSP 240 may include, e.g., polysilicon doped with n-type impurities. Alternatively, the CSP 240 may include a metal silicide layer and a doped polysilicon layer sequentially stacked. The metal silicide layer may include, e.g., tungsten silicide.

The sacrificial layer structure 290 may include first, second, and third sacrificial layers 260, 270, and 280 sequentially stacked. The first and third sacrificial layers 260 and 280 may include an oxide, e.g., silicon oxide, and the second sacrificial layer 270 may include a nitride, e.g., silicon nitride.

The support layer 300 may include a material having an etching selectivity with respect to the first to third sacrificial layers 260, 270, and 280, e.g., polysilicon doped with n-type impurities. In some embodiments, the support layer 300 may be formed by forming a doped or undoped amorphous silicon layer and performing a heat treatment process on the amorphous silicon layer to crystalize amorphous silicon.

The support layer 300 may have a uniform thickness, and thus a first recess may be formed on a portion of the support layer 300 in the first opening 302. For example, a thickness of the support layer 300 in the first opening 302 may be the same as a thickness of the support layer 300 above the sacrificial layer structure 290. Hereinafter, the portion of the support layer 300 in the first opening 302 may be referred to as a support pattern 305. In some embodiments, the support pattern 305 may have a u-shape.

An insulation layer 310 and a fourth sacrificial layer 320 may be alternately and repeatedly stacked on the support layer 300 and the support pattern 305, and thus a mold layer including the insulation layers 310 and the fourth sacrificial layers 320 alternately stacked may be formed. The insulation layer 310 may include an oxide, e.g., silicon oxide, and the fourth sacrificial layer 320 may include a material having an etching selectivity with respect to the insulation layer 310, e.g., a nitride such as silicon nitride. In example embodiments, a thickness of the lowermost insulating layer 310 above the recess formed on the first opening 302 may be greater than a thickness of the lowermost insulating layer 310 above the sacrificial layer structure 290. For example, the lowermost insulating layer 310 may fill the first opening 302.

An etching process may be performed on the mold layer using a photoresist pattern as an etching mask, and a trimming process in which an area of the photoresist pattern is reduced by a given ratio may be performed. The etching process and the trimming process may be alternately and repeatedly performed to form a mold including a plurality of step layers each having the fourth sacrificial layer 320 and the insulation layer 310. Hereinafter, the "step layer" may be defined as not only an exposed portion but also a non-exposed portion of the fourth sacrificial layer 320 and the insulation layer 310 at the same level, and the exposed portion thereof may be defined as a "step."

Figure 6:
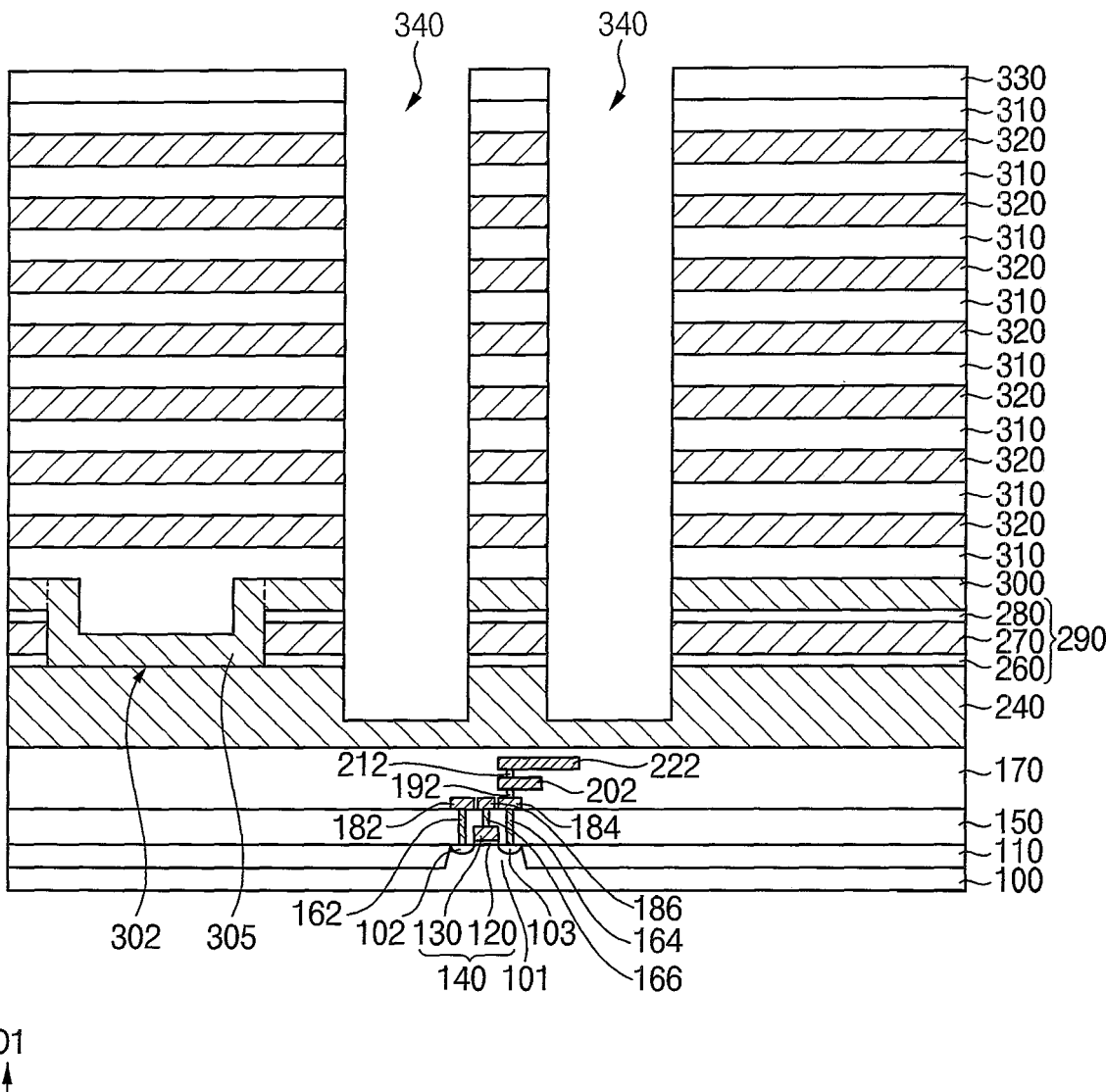

Referring to FIG. 6, a third insulating interlayer 330 may be formed on the substrate 100 to cover the mold, and a dry etching process may be performed to form a channel hole 340 extending in the first direction D1 through the third insulating interlayer 330 and the mold and exposing an upper surface of the CSP 240. The third insulating interlayer 330 may contact an upper surface of the uppermost one of the insulating layers 310.

In example embodiments, the dry etching process may be performed until the channel hole 340 may expose the upper surface of the CSP 240, and further the channel hole 340 may extend through an upper portion of the CSP 240. For example, a level of a lower surface of the channel hole 340 may be lower than a level of the upper surface of the CSP 240. In example embodiments, a plurality of channel holes 340 may be spaced apart from each other in the second and third directions D2 and D3.

Figure 7:
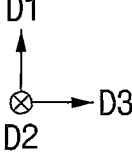

Referring to FIG. 7, a charge storage layer structure 380 and a channel layer 390 may be sequentially formed on a sidewall of the channel hole 340, the exposed upper surface of the CSP 240, and the third insulating interlayer 330, and a first filling layer 410 may be formed on the channel layer 390 to fill the channel hole 340.

The charge storage layer structure 380 may include a first blocking layer 350, a charge storage layer 360, and a tunnel insulation layer 370 sequentially stacked. The first blocking layer 350 and the tunnel insulation layer 370 may include an oxide, e.g., silicon oxide, and the charge storage layer 360 may include a nitride, e.g., silicon nitride. The channel layer 390 may include, e.g., amorphous silicon that is undoped or lightly doped with impurities, and the first filling layer 410 may include a material having a thermal conductivity equal to or greater than about 100 W/m·K at a temperature of about 25° C.

In example embodiments, the first filling layer 410 may include a 2-dimensional material having a dielectric constant equal to or less than about 11.7 and a band gap equal to or more than about 6 eV. The first filling layer 410 may include, e.g., boron nitride (BN), aluminum nitride (AlN), beryllium oxide (BeO), etc.

A heat treatment process may be performed on the first filling layer 410 to crystallize the channel layer 390. The heat treatment process may be performed by providing heat onto the first filling layer 410, the heat provided onto the first filling layer 410 may be transferred to the channel layer 390 covering the first filling layer 410, and thus the channel layer 390 may be crystallized by the heat transferred from the first filling layer 410.

The first filling layer 410 may include the 2-dimensional material having the thermal conductivity equal to or more than about 100 W/m·K at a temperature of about 25° C., and thus even a small amount of heat provided onto the first filling layer 410 may be conducted to not only an upper portion but also a lower portion of the channel layer 390. Thus, electrical characteristics of the lower circuit pattern under the channel layer 390 may not be deteriorated by heat provided onto the first filling layer 410.

In example embodiments, the heat treatment process may include a laser annealing process. The laser annealing process may be performed by radiating laser onto only the first filling layer 410 in the first direction D1, and thus no heat may be provided to the mold and the charge storage layer structure 380. Accordingly, the mold and the charge storage layer structure 380 may be prevented from deteriorating by heat.

Figure 8:
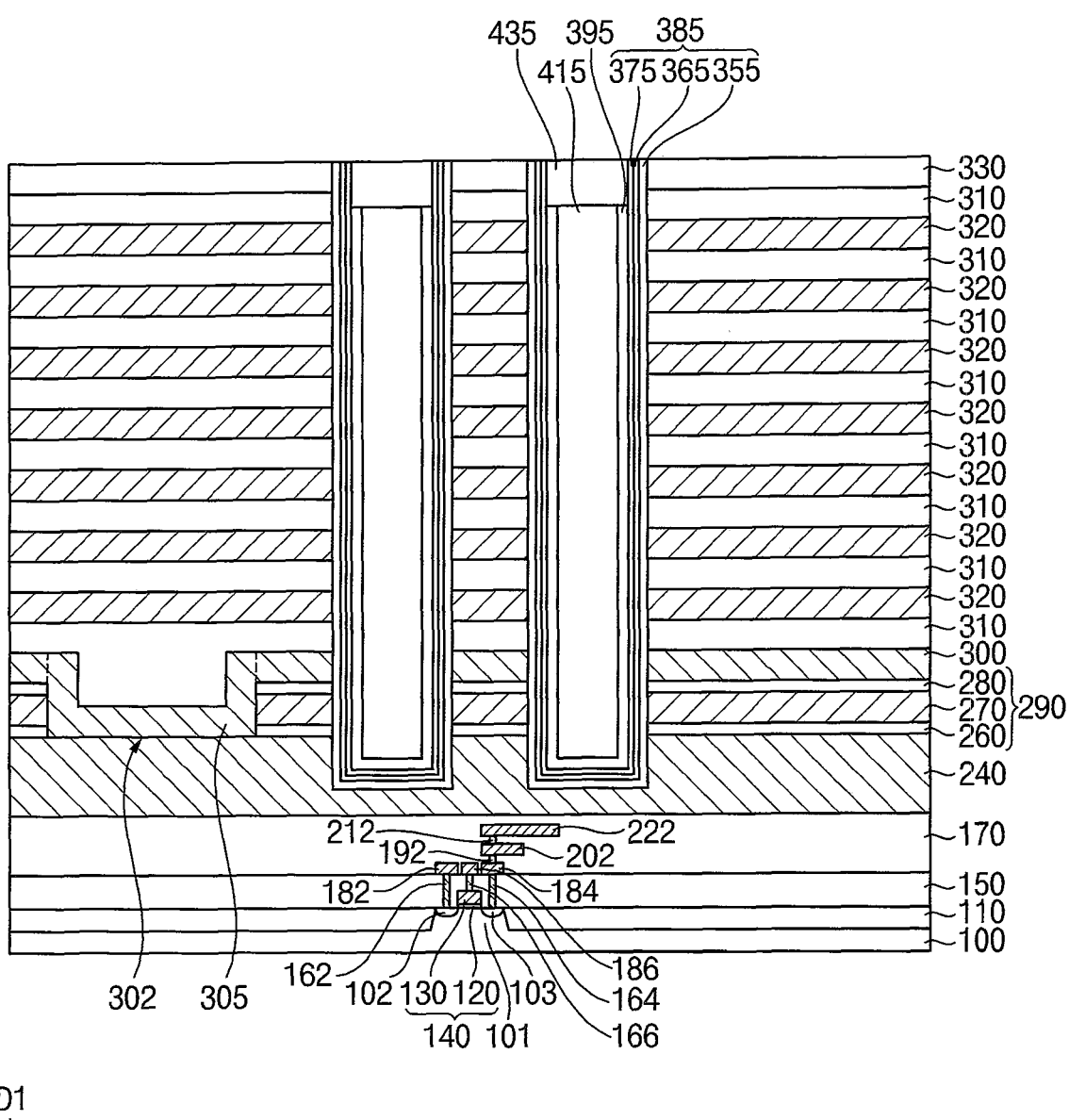

Referring to FIG. 8, the first filling layer 410, the channel layer 390, and the charge storage layer structure 380 may be planarized until an upper surface of the third insulating interlayer 330 is exposed, and thus a first filling pattern 415, a channel 395, and a charge storage structure 385 may be formed in the channel hole 340. The charge storage structure 385 may include a first blocking pattern 355, a charge storage pattern 365 and a tunnel insulation pattern 375 sequentially stacked on a bottom and a sidewall of the channel hole 340.

In example embodiments, the first filling pattern 415 may have a pillar shape extending in the first direction D1, and each of the channel 395 and the charge storage structure 385 may have a cup-like shape.

A plurality of channels 395 may define a channel array.

Upper portions of the first filling pattern 415 and the channel 395 may be removed to form a second recess, a pad layer may be formed on the first filling pattern 415, the channel 395, and the charge storage structure 385 to fill the second recess, and the pad layer may be planarized until an upper surface of the third insulating interlayer 330 is exposed to form a pad 435 on the first filling pattern 415 and the channel 395, which may contact an inner upper sidewall of the charge storage structure 385. For example, an upper surface of the pad 435 may be coplanar with the upper surface of the third insulating interlayer 330. The pad 435 may include, e.g., doped polysilicon.

The charge storage structure 385, the channel 395, the first filling pattern 415, and the pad 435 may form a memory channel structure.

Figure 9:
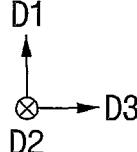

Referring to FIG. 9, a fourth insulating interlayer 440 may be formed on the third insulating interlayer 330, the pad 435, and the charge storage structure 385, and a second opening 450 may be formed partially through the third and fourth insulating interlayers 330 and 440 and the mold by a dry etching process.

In example embodiments, the dry etching process may be performed until the second opening 450 exposes an upper surface of the support layer 300 or the support pattern 305, and further, the second opening 450 may extend through an upper portion of the support layer 300 or the support pattern 305. As the second opening 450 is formed, the insulation layer 310 and the fourth sacrificial layer 320 included in the mold may be exposed.

In example embodiments, the second opening 450 may extend lengthwise in the second direction D2, and a plurality of second openings 450 may be formed in the third direction D3. As the second opening 450 is formed, the insulation layer 310 may be divided into insulation patterns 315 each of which may extend lengthwise in the second direction D2, and the fourth sacrificial layer 320 may be divided into fourth sacrificial patterns 325 each of which may extend lengthwise in the second direction D2.

A spacer layer may be formed on a sidewall of the second opening 450, the upper surfaces of the support layer 300 and the support pattern 305 exposed by the second opening 450, and the fourth insulating interlayer 440, and may be aniso-tropically etched so that portions of the spacer layer on the support layer 300 and the support pattern 305 may be removed to form a spacer 460, and the upper surfaces of the support layer 300 and the support pattern 305 may be partially exposed.

In example embodiments, the spacer 460 may include, e.g., undoped amorphous silicon or undoped polysilicon. If the spacer 460 includes undoped amorphous silicon, the spacer may be crystallized by heat generated from deposition processes of forming other layers so as to include undoped polysilicon.

The exposed portions of the support layer 300 and the support pattern 305 and a portion of the sacrificial layer structure 290 thereunder may be removed to enlarge the second opening 450. Thus, the second opening 450 may expose an upper surface of the CSP 240, and further, may extend through an upper portion of the CSP 240. For example, a level of a lower surface of the second opening 450 may be lower than a level of the upper surface of the CSP 240.

When the sacrificial layer structure 290 is partially removed, a sidewall of the second opening 450 may be covered by the spacer 460, and the spacer 460 may include a material different from the sacrificial layer structure 290, and thus the insulation pattern 315 and the fourth sacrificial pattern 325 included in the mold might not be removed.

Figure 10:
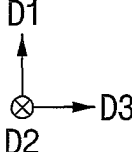

Referring to FIG. 10, the sacrificial layer structure 290 exposed by the second opening 450 may be removed to form a first gap 470 exposing a lower outer sidewall of the charge storage structure 385, and further, a portion of the charge storage structure 385 exposed by the first gap 470 may be removed to expose a lower outer sidewall of the channel 395.

The sacrificial layer structure 290 and the charge storage structure 385 may be removed by a wet etching process, using e.g., fluoric acid and/or phosphoric acid. When the first gap 470 is formed, the support layer 300, the support pattern 305, the channel 395, and the first filling pattern 415 might not be removed and, therefore, may remain to support the mold.

As the first gap 470 is formed, the charge storage structure 385 may be divided into an upper portion extending through the mold to cover most portions of the outer sidewall of the channel 395 and a lower portion covering a lower surface of the channel 395 on the CSP 240.

Figure 11:
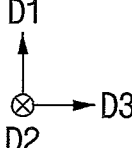

Referring to FIG. 11, after removing the spacer 460, a channel connection pattern 480 may be formed to fill the first gap 470.

The channel connection pattern 480 may be formed by forming a channel connection layer on the sidewall of the second opening 450, the exposed upper surface of the CSP 240, and the fourth insulating interlayer 440, and performing an etch back process on the channel connection layer. The channel connection layer may include, e.g., amorphous silicon doped with n-type impurities, and may be crystallized by heat generated from deposition processes of forming other layers so as to include polysilicon doped with n-type impurities. As the channel connection pattern 480 is formed, the channels 395 between neighboring ones of the second openings 450 in the third direction D3 may be connected with each other to form a channel block.

An air gap 490 may be formed in the channel connection pattern 480.

Figure 12:
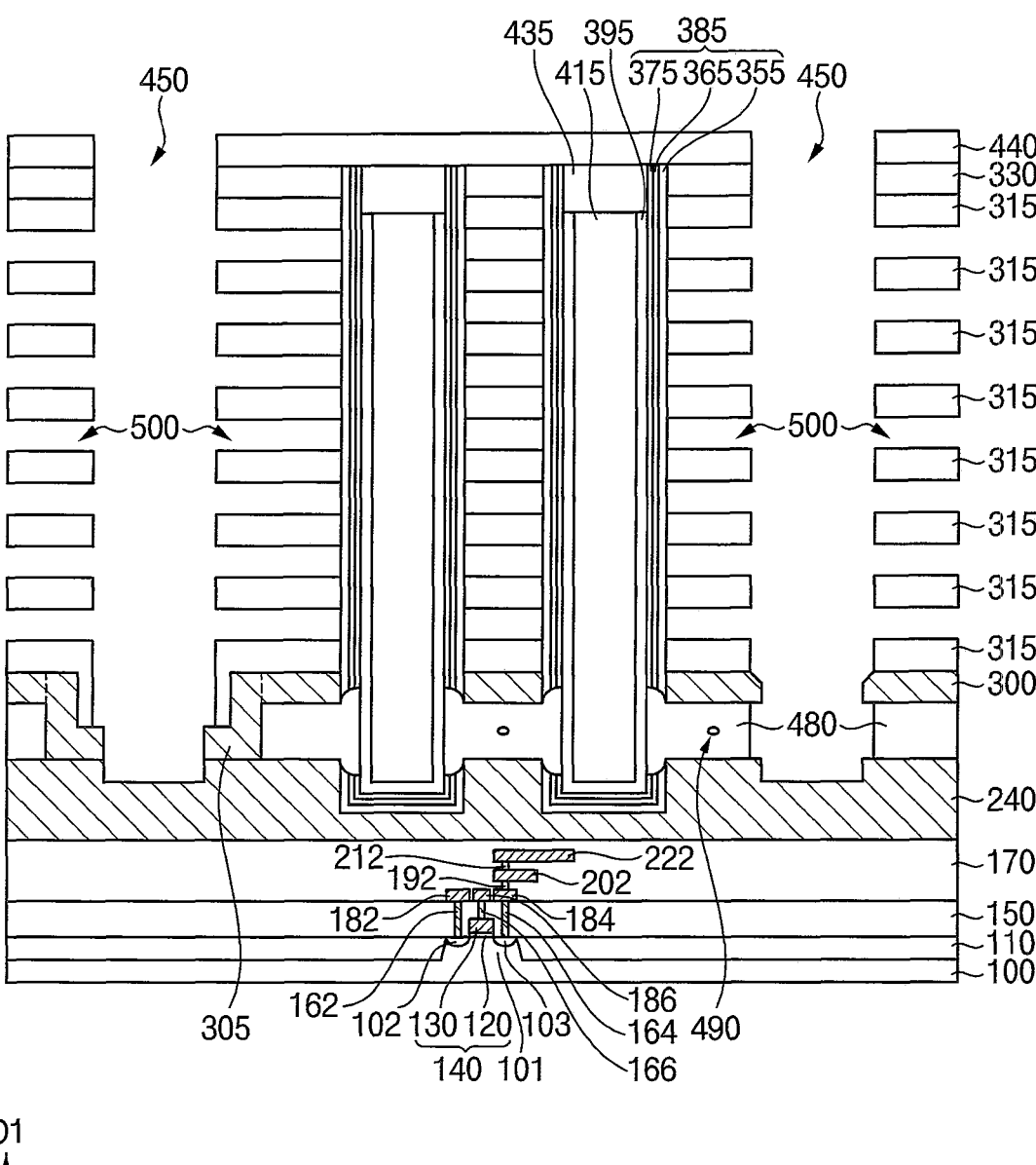

Referring to FIG. 12, the fourth sacrificial patterns 325 may be removed to form second gaps 500 exposing an outer sidewall of the charge storage structure 385. The fourth sacrificial patterns 325 may be removed by a wet etching process, using e.g., phosphoric acid ($H_3PO_4$) or sulfuric acid ($H_2SO_4$).

Figure 13:
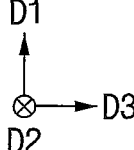

Referring to FIG. 13, a second blocking layer may be formed on the outer sidewalls of the charge storage structures 385 exposed by the second gaps 500, inner walls of the second gaps 500, surfaces of the insulation patterns 315, sidewalls of the support layer 300 and the support pattern 305, a sidewall of the channel connection pattern 480, the upper surface of the CSP 240, and an upper surface of the fourth insulating interlayer 440, and a gate electrode layer may be formed on the second blocking layer to fill the second gaps 500 and the second opening 450. The gate electrode layer may include a gate barrier layer and a gate conductive layer sequentially stacked.

The second blocking layer may include, e.g., a metal oxide, the gate barrier layer may include a metal nitride, e.g., titanium nitride, tantalum nitride, tungsten nitride, etc., and the gate conductive layer may include a metal, e.g., tungsten, copper, etc.

The gate electrode layer may be partially removed to form a gate electrode 520 in each of the second gaps 500. In example embodiments, the gate electrode layer may be partially removed by a wet etching process.

In example embodiments, the gate electrode 520 may extend lengthwise in the second direction D2, and a plurality of gate electrodes 520 may be spaced apart from each other in the first direction D1 to form a gate electrode structure. Additionally, a plurality of gate electrode structures may be spaced apart from each other in the third direction D3 by the second opening 450. The gate electrodes 520 included in each of the gate electrode structures may be stacked in a staircase shape in which extension lengths in the second direction D2 decrease in a stepwise manner from a lowermost level toward an uppermost level.

In example embodiments, each of the gate electrode structures may include first to third gate electrodes sequentially stacked in the first direction D1. In example embodiments, the first gate electrode may be formed at a lowermost level, and may serve as a ground selection line (GSL). The third gate electrode may be formed at an uppermost level and a second level from above, and may serve as a string selection line (SSL). The second gate electrode may be formed at a plurality of levels between the first and third gate electrodes, and may serve as word lines, respectively. However, the numbers of levels at which the first to third gate electrodes are formed might not be limited to the above, and may be varied. Additionally, each of the gate electrode structures may include fourth gate electrode under the first gate electrode and/or over the third gate electrode. The fourth gate electrode may be formed at one or a plurality of levels, and may serve as a gate induced drain leakage (GIDL) electrode, which may use GIDL phenomenon to enable body erase. Some of the second gate electrodes may serve as dummy word lines.

A division layer may be formed on the second blocking layer to fill the second opening 450, and the division layer and the second blocking layer may be planarized until the upper surface of the fourth insulating interlayer 440 is exposed. Thus, the second blocking layer may be transformed into a second blocking pattern 510, and the division layer may form a division pattern 530 extending lengthwise in the second direction D2 in the second opening 450. Upper surfaces of the second blocking pattern 510 and the division pattern 530 may be coplanar with the upper surface of the fourth insulating interlayer 440.

Figure 14:
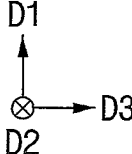

Referring to FIG. 14, a fifth insulating interlayer 540 may be formed on the fourth insulating interlayer 440, the division pattern 530, and the second blocking pattern 510, and a contact plug 550 may be formed through the fourth and fifth insulating interlayers 440 and 540 to contact an upper surface of the pad 435.

A bit line 560 contacting an upper surface of the contact plug 550 may be formed. In example embodiments, the bit line 560 may extend lengthwise in the third direction D3, and a plurality of bit lines 560 may be spaced apart from each other in the second direction D2.

Upper contact plugs contacting upper surfaces of the gate electrodes 520, respectively, and upper wirings for applying electrical signals to the upper contact plugs may be further formed to complete the fabrication of the semiconductor device.

As illustrated above, the first filling layer 410 may include a 2-dimensional material having a thermal conductivity equal to or more than about 100 W/m·K at a temperature of about 25° C., and thus even though a small amount of heat is provided onto an upper portion of the first filling layer 410, the heat may be conducted into a lower portion thereof. Accordingly, not only an upper portion of the channel layer 390 but also a lower portion thereof may be easily crystallized by heat. Additionally, the channel layer 390 may be crystallized by the small amount of heat, and thus electrical characteristics of the lower circuit pattern under the channel layer 390 may not deteriorate by heat.

The 2-dimensional material of the first filling layer 410 may have a dielectric constant equal to or less than about 11.7 and a bandgap equal to or more than about 6 eV, and thus the first filling pattern 415 may serve as an insulation pattern in the memory channel structure.

The semiconductor device manufactured by the above processes may have the following structural characteristics.

The semiconductor device may include the lower circuit pattern on the substrate 100, the CSP 240 over the lower circuit pattern, the gate electrode structure including the gate electrodes 520 spaced apart from each other in the first direction D1 on the CSP 240, the insulation patterns 315 spaced apart from each other in the first direction D1 and between neighboring ones of the gate electrodes 520, the memory channel structure extending through the gate electrode structure in the first direction D1, and the upper contact plugs extending in the first direction D1 and being connected to the gate electrodes 520, respectively. Additionally, the semiconductor device may include the support layer 300, the support pattern 305, the channel connection pattern 480, the second blocking pattern 510, the division pattern 530, the contact plug 550, the bit line 560, and the first to fifth insulating interlayers 150, 170, 330, 440, and 540.

The memory channel structure may include the first filling pattern 415 extending in the first direction D1, the channel 395 on a sidewall of the first filling pattern 415, the charge storage structure 385 on a sidewall of the channel 395, and the pad 435 on upper surfaces of the first filling pattern 415 and the channel 395 and an inner sidewall of the charge storage structure 385.

In example embodiments, a plurality of gate electrode structures may be spaced apart from each other in the third direction D3 by the division pattern 530.

Figure 15:
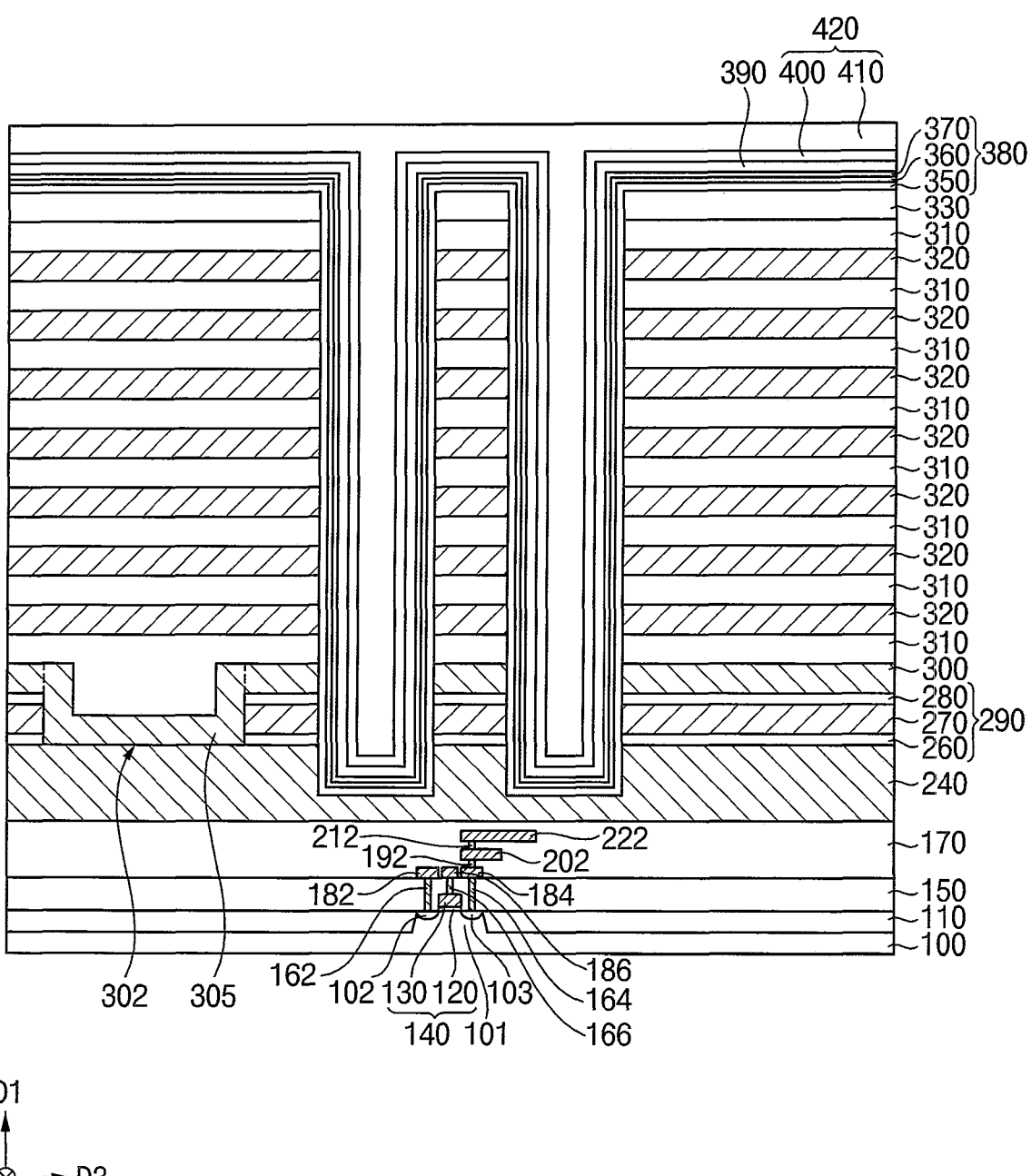
FIGS. 15 and 16 are cross-sectional views illustrating a method of manufacturing a semiconductor device in accordance with example embodiments.
Figure 16:
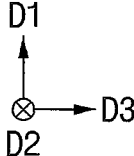

FIGS. 15 and 16 are cross-sectional views illustrating a method of manufacturing a semiconductor device in accordance with example embodiments. This method may include processes substantially the same as or similar to those illustrated with reference to FIGS. 4 to 14, and repeated explanations thereof are omitted herein.

Referring to FIG. 15, processes substantially the same as or similar to those illustrated with reference to FIGS. 4 to 7 may be performed so that the charge storage layer structure 380 and the channel layer 390 may be sequentially formed on the exposed upper surface of the CSP 240 and an upper surface of the third insulating interlayer 330, and a filling layer structure 420 may be formed on the channel layer 390 to fill a remaining portion of the channel hole 340.

The filling layer structure 420 may include a second filling layer 400 and the first filling layer 410. The first filling layer 410 may include a material having a thermal conductivity equal to or more than about 100 W/m·K, and the second filling layer 400 may include a material having a thermal conductivity less than that of the first filling layer 410, e.g., an oxide such as silicon oxide.

In example embodiments, the first filling layer 410 may include a 2-dimensional material having a dielectric constant equal to or less than about 11.7 and a band gap equal to or more than about 6 eV. The first filling layer 410 may include, e.g., boron nitride (BN), aluminum nitride (AlN), beryllium oxide (BeO), etc.

A heat treatment process may be performed on the first filling layer 410 so that the channel layer 390 may be crystallized. The heat treatment process may be performed on the first filling layer 410 in the first direction D1, the heat provided onto the first filling layer 410 may be transferred to the channel layer 390 through the second filling layer 400, and thus the channel layer 390 may be crystallized by the heat provided onto the first filling layer 410.

Referring to FIG. 16, processes substantially the same as or similar to those illustrated with reference to FIGS. 8 to 14 may be performed to complete the fabrication of the semiconductor device.

In the semiconductor device, a second filling pattern 405 may be formed on an outer sidewall of the first filling pattern 415, the first filling pattern 415 may have a pillar shape, and the second filling pattern 405 may have a cup-like shape covering a sidewall and a lower surface of the first filling pattern 415.

The second filling pattern 405 and the first filling pattern 415 may form a filling pattern structure 425, and the charge storage structure 385, the channel 395, the filling pattern structure 425, and the pad 435 may form the memory channel structure.

Figure 17:
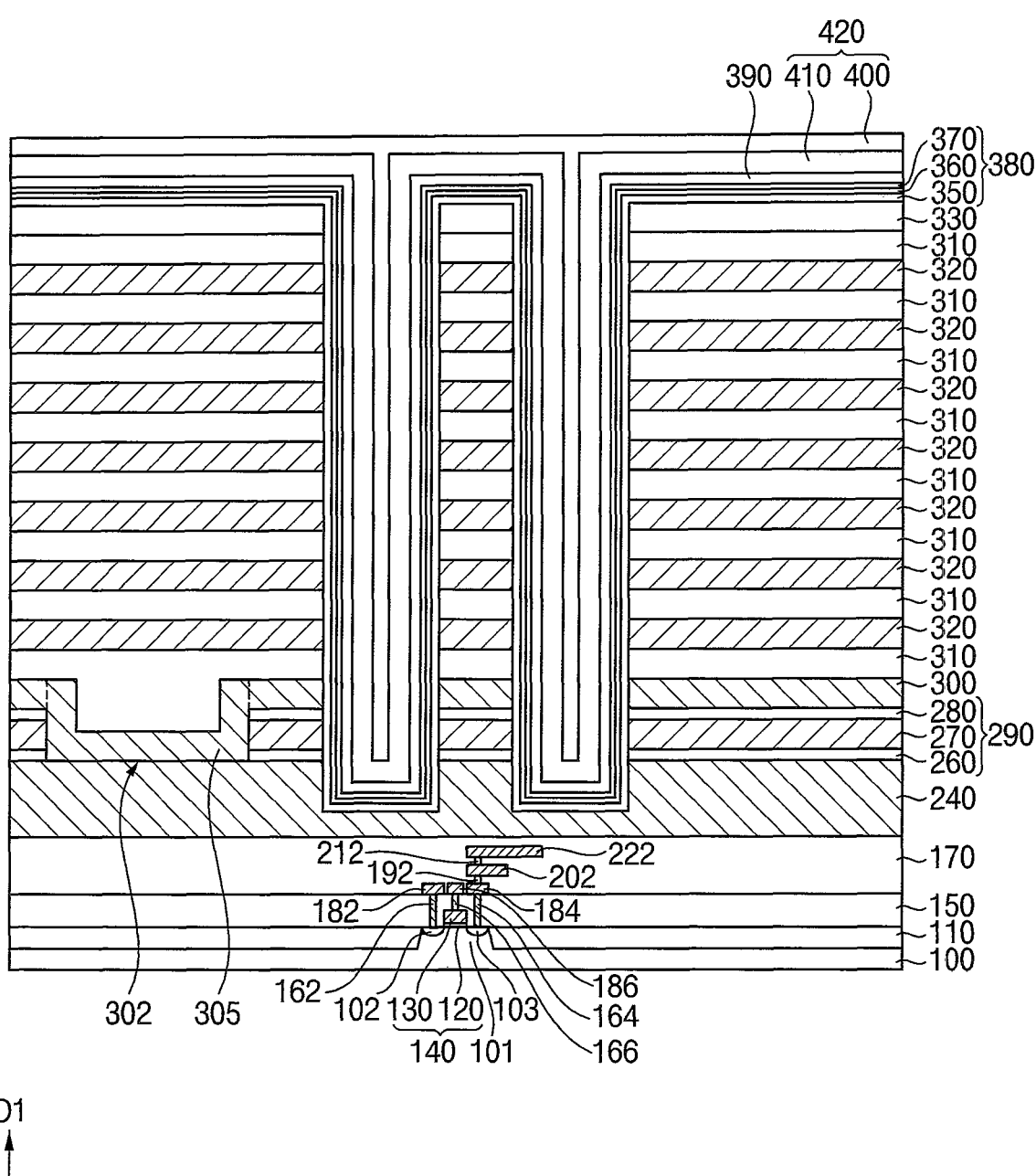
FIGS. 17 and 18 are cross-sectional views illustrating a method of manufacturing a semiconductor device in accordance with example embodiments.
Figure 18:
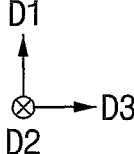

FIGS. 17 and 18 are cross-sectional views illustrating a method of manufacturing a semiconductor device in accordance with example embodiments. This method may include processes substantially the same as or similar to those illustrated with reference to FIGS. 15 and 16, and repeated explanations thereof are omitted herein.

Referring to FIG. 17, processes substantially the same as or similar to those illustrated with reference to FIG. 15 may be performed so that the filling layer structure 420 may be formed on the channel layer 390 to fill a remaining portion of the channel hole 340, and the filling layer structure 420 may include the first filling layer 410 and the second filling layer 400.

A heat provided onto the first filling layer 410 may be transferred to the channel layer 390, and thus the channel layer 390 may be crystallized by the heat provided onto the first filling layer 410.

Referring to FIG. 18, processes substantially the same as or similar to those illustrated with reference to FIG. 16 may be performed to complete the fabrication of the semiconductor device.

In the semiconductor device, the second filling pattern 405 may be formed on an inner sidewall of the first filling pattern 415, the first filling pattern 415 may have a cup-like shape, and the second filling pattern 405 may fill a space formed by the first filling pattern 415.

While example embodiments have been particularly shown and described, it will be understood by one of ordinary skill in the art that variations in form and detail may be made therein without departing from the spirit and scope of the claims.

What is claimed is:

1. A semiconductor device comprising:
gate electrodes on a substrate, the gate electrodes being spaced apart from each other in a vertical direction substantially perpendicular to an upper surface of the substrate; and
a memory channel structure extending through the gate electrodes in the vertical direction on the substrate,
wherein the memory channel structure includes:
a first filling pattern having a pillar shape extending in the vertical direction, the first filling patter being a single layer;
a channel on and contacting a sidewall a bottom surface of the first filling pattern; and
a charge storage structure on a sidewall of the channel, and
wherein the first filling pattern includes a material having a thermal conductivity equal to or more than 100 W/m·K at a temperature of −25° C.

2. The semiconductor device of claim 1, wherein the first filling pattern includes a 2-dimensional material.

3. The semiconductor device of claim 1, wherein the first filling pattern includes boron nitride (BN), aluminum nitride (AlN), and/or beryllium oxide (BeO).

4. The semiconductor device of claim 1, wherein the first filling pattern includes the material having a dielectric constant equal to or less than about 11.7.

5. The semiconductor device of claim 1, wherein the first filling pattern includes the material having a bandgap equal to or more than about 6 eV.

6. The semiconductor device of claim 1,
wherein the semiconductor device further comprises a second filling pattern includes silicon oxide.

7. The semiconductor device of claim 1, further comprising a second filling pattern between the first filling pattern and the channel, the second filling pattern including silicon oxide.

8. The semiconductor device of claim 1, wherein the charge storage structure includes a tunnel insulation pattern, a charge storage pattern, and a blocking pattern sequentially stacked on the sidewall of the channel in a horizontal direction substantially parallel to the upper surface of the substrate.

9. A semiconductor device comprising:

gate electrodes on a substrate, the gate electrodes being spaced apart from each other in a vertical direction substantially perpendicular to an upper surface of the substrate; and a memory channel structure extending through the gate electrodes in the vertical direction on the substrate, wherein the memory channel structure includes:

a filling pattern structure extending in the vertical direction;

a channel on a sidewall of the filling pattern structure; and a charge storage structure on a sidewall of the channel, wherein the filling pattern structure includes:

a first filling pattern having a pillar shape and including a material having a thermal conductivity equal to or more than about 100 W/m·K at a temperature of 25° C., the first filling pattern being a single layer; and a second filling pattern on and contacting an outer sidewall of the first filling pattern, the second filling pattern including a material having a thermal conductivity less than that of the first filling pattern, wherein the second filling pattern has a cup-like shape and wherein the channel contacts a sidewall of the second filling pattern.

10. The semiconductor device of claim 9, wherein the second filling pattern contacts a lower surface of the first filling pattern.

11. The semiconductor device of claim 9, wherein the first filling pattern includes boron nitride (BN), aluminum nitride (AlN), and/or beryllium oxide (BeO), and wherein the second filling pattern includes silicon oxide.

12. The semiconductor device of claim 9, wherein the first filling pattern includes the material having a dielectric constant equal to or less than about 11.7.

13. A semiconductor device comprising:

a gate electrode structure on a substrate, the gate electrode structure including gate electrodes spaced apart from each other in a vertical direction substantially perpendicular to an upper surface of the substrate; and a memory channel structure extending through the gate electrode structure in the vertical direction on the substrate; and wherein the memory channel structure includes:

a first filling pattern extending in the vertical direction and having a cup-like shape;

a second filling pattern at contacts an inner sidewall of the first filling pattern and fills a central space formed by the first filling pattern;

a channel contacting an outer sidewall of the first filling pattern; and a charge storage structure on a sidewall of the channel, and wherein the first filling pattern includes a material having a thermal conductivity equal to or more than about 100 W/m·K at a temperature of −25° C.

14. The semiconductor device of claim 13, wherein the second filling pattern includes silicon oxide.

15. The semiconductor device of claim 14, wherein the first filling pattern includes the material having a dielectric constant equal to or less than about 11.7.

16. The semiconductor device of claim 14, wherein the first filling pattern includes boron nitride (BN), aluminum nitride (AlN), and/or beryllium oxide (BeO).

17. The semiconductor device of claim 13, wherein the second filling pattern has a pillar shape.

18. The semiconductor device of claim 13, wherein the first filling pattern is formed from a single material layer.

* * * * *